(12) United States Patent
Peng

(10) Patent No.: US 6,667,902 B2
(45) Date of Patent: Dec. 23, 2003

(54) SEMICONDUCTOR MEMORY CELL AND MEMORY ARRAY USING A BREAKDOWN PHENOMENA IN AN ULTRA-THIN DIELECTRIC

(75) Inventor: Jack Zezhong Peng, San Jose, CA (US)

(73) Assignee: Kilopass Technologies, Inc., Sunnyvale, CA (US)

( * ) Notice: Subject to any disclaimer, the term of this patent is extended or adjusted under 35 U.S.C. 154(b) by 180 days.

(21) Appl. No.: 10/024,327

(22) Filed: Dec. 17, 2001

(65) Prior Publication Data

US 2003/0198085 A1 Oct. 23, 2003

Related U.S. Application Data

(63) Continuation-in-part of application No. 09/955,641, filed on Sep. 18, 2001.

(51) Int. Cl.[7] ................................................ G11C 11/34
(52) U.S. Cl. ........................ 365/182; 365/94; 365/103; 365/104; 365/185.18; 365/189.11; 365/226; 257/69; 257/204; 257/321
(58) Field of Search .......................... 365/182, 94, 103, 365/189.11, 185.18, 226; 257/321, 69, 204, 319

(56) References Cited

U.S. PATENT DOCUMENTS

| | | | |
|---|---|---|---|
| 3,634,929 A | 1/1972 | Yoshida et al. ............... 29/577 |
| 4,322,822 A | 3/1982 | McPherson ................. 365/182 |
| 4,488,262 A | 12/1984 | Basire et al. ............... 365/104 |
| 4,490,900 A | 1/1985 | Chiu | |
| 4,502,208 A | 3/1985 | McPherson ................. 438/281 |
| 4,507,757 A | 3/1985 | McElroy ..................... 365/104 |
| 4,543,594 A | 9/1985 | Mohsen et al. ............. 257/530 |
| 4,599,705 A | 7/1986 | Holmberg et al. .......... 365/163 |
| 4,613,886 A | 9/1986 | Chwang ..................... 257/369 |
| 4,677,742 A | 7/1987 | Johnson ....................... 29/591 |
| 4,823,181 A | 4/1989 | Mohsen et al. ............. 257/530 |
| 4,876,220 A | 10/1989 | Mohsen et al. ............. 438/200 |
| 4,899,205 A | 2/1990 | Hamdy et al. .............. 257/530 |
| 4,943,538 A | 7/1990 | Mohsen et al. ............. 438/215 |
| 5,138,410 A | 8/1992 | Takebuchi .................. 257/314 |
| 5,304,871 A | 4/1994 | Dharmarajan et al. ........ 326/44 |

(List continued on next page.)

OTHER PUBLICATIONS

Miranda, Enrique et al; Analytic Modeling of Leakage Current Through Multiple Breakdown Paths in SiO2 Films; 39th Annual International Reliability Physics Symposium; Orlando, FL 2001.

Lombardo, S. et al; Softening of Breakdown in Ultra–Thin Gate Oxide nMOSFET's at Low Inversion Layer Density; 39th Annual International Reliability Physics Symposium; Orlando, FL 2001.

Wu, E.W. et al; Voltage–Dependent Voltage–Acceleration of Oxide Breakdown for Ultra–Thin Oxides; IEEE, 2000.

Rasras, Mahmoud et al; Substrate Hole Current Origin After Oxide Breakdown; IEEE, 2000.

Sune, Jordi et al; Post Soft Breakdown Conduction in SiO2 Gate Oxides; IEEE, 2000.

Primary Examiner—Van Thu Nguyen
Assistant Examiner—Pho Luu
(74) Attorney, Agent, or Firm—Perkins Coie LLP

(57) ABSTRACT

A semiconductor memory cell having a data storage element constructed around an ultra-thin dielectric, such as a gate oxide, is used to store information by stressing the ultra-thin dielectric into breakdown (soft or hard breakdown) to set the leakage current level of the memory cell. The memory cell is read by sensing the current drawn by the cell. A suitable ultra-thin dielectric is high quality gate oxide of about 50 Å thickness or less, as commonly available from presently available advanced CMOS logic processes.

13 Claims, 17 Drawing Sheets

U.S. PATENT DOCUMENTS

| | | | |
|---|---|---|---|
| 5,412,244 A | 5/1995 | Hamdy et al. | 257/530 |
| 5,477,499 A * | 12/1995 | Van Buskirk et al. | 365/185.3 |
| 5,496,756 A | 3/1996 | Sharma et al. | 438/258 |
| 5,576,568 A | 11/1996 | Kowshik | 257/318 |
| 5,578,848 A | 11/1996 | Kwong et al. | |
| 5,587,603 A | 12/1996 | Kowshik | 257/316 |
| 5,600,265 A | 2/1997 | El Gamal et al. | 326/41 |
| 5,675,541 A | 10/1997 | Leterrier | 365/189.01 |
| 5,675,547 A | 10/1997 | Koga | |
| 5,825,200 A | 10/1998 | Kolze | 326/38 |
| 5,825,201 A | 10/1998 | Kolze | 326/39 |
| 5,880,512 A | 3/1999 | Gordon et al. | 257/530 |
| 5,909,049 A | 6/1999 | McCollum | |
| 6,034,893 A | 3/2000 | Mehta | |
| 6,064,595 A | 5/2000 | Logie et al. | |
| 6,084,428 A | 7/2000 | Kolze et al. | 326/41 |
| 6,097,077 A | 8/2000 | Gordon et al. | 257/530 |
| 6,157,568 A | 12/2000 | Schmidt | |
| 6,214,666 B1 | 4/2001 | Mehta | |
| 6,215,140 B1 | 4/2001 | Reisinger et al. | |
| 6,232,631 B1 | 5/2001 | Schmidt et al. | |
| 6,282,123 B1 | 8/2001 | Mehta | |
| 6,294,809 B1 | 9/2001 | Logie | |
| 6,297,103 B1 | 10/2001 | Ahn et al. | |
| 6,351,428 B2 * | 2/2002 | Forbes | 365/230.06 |
| 6,421,293 B1 | 7/2002 | Candelier et al. | |
| 6,456,535 B2 * | 9/2002 | Forbes et al. | 365/185.28 |

* cited by examiner

| OPERATION | R/C SELECT STATUS | V ROW | V COLUMN | V COLUMN SOURCE | V OXIDE | RESULT |
|---|---|---|---|---|---|---|
| PROGRAM | SR/SC | 2.5 | 7.0 | 0 | 7.0 | PROGRAM |
|  | SR/UC | 2.5 | 0 | 0 | 0 | NO CHANGE |
|  | UR/SC | 0 | 7.0 | 0 | <4.0 | NO CHANGE |
|  | UR/UC | 0 | 0 | 0 | 0 | NO CHANGE |
| READ | SR/SC | 2.5 | 1.5 | 0 |  | CURRENT SENSED |
|  | SR/UC | 2.5 | 0 | 0 |  | NO CURRENT |
|  | UR/SC | 0 | 1.5 | 0 |  | NO CURRENT |
|  | UR/UC | 0 | 0 | 0 |  | NO CURRENT |

| OPERATION | R/C SELECT STATUS | V ROW | V COLUMN | V SOURCE | V OXIDE | RESULT |
|---|---|---|---|---|---|---|
| PROGRAM | SR/SC | 7.0 | 7.0 | 0 | 6.6 | PROGRAM |
|  | SR/UC | 7.0 | 0 | 0 | 0 | NO CHANGE |
|  | UR/SC | 0 | 7.0 | 0 | <4.0 | NO CHANGE |
|  | UR/UC | 0 | 0 | 0 | 0 | NO CHANGE |
| READ | SR/SC | 2.5 | 1.5 | 0 |  | CURRENT SENSED |
|  | SR/UC | 2.5 | 0 | 0 |  | NO CURRENT |
|  | UR/SC | 0 | 1.5 | 0 |  | NO CURRENT |
|  | UR/UC | 0 | 0 | 0 |  | NO CURRENT |

| OPERATION | R/C SELECT STATUS | V ROW | V COLUMN | V SOURCE | V OXIDE | RESULT |
|---|---|---|---|---|---|---|
| PROGRAM | SR/SC | 2.5 | 2.5 | -4.5 | 6.6 | PROGRAM |
|  | SR/UC | 2.5 | 0 | -4.5 | 4.0 | NO CHANGE |
|  | UR/SC | 0 | 2.5 | -4.5 | <4.0 | NO CHANGE |
|  | UR/UC | 0 | 0 | -4.5 | <4.0 | NO CHANGE |
| READ | SR/SC | 2.5 | 1.5 | 0 |  | CURRENT SENSED |
|  | SR/UC | 2.5 | 0 | 0 |  | NO CURRENT |
|  | UR/SC | 0 | 1.5 | 0 |  | NO CURRENT |
|  | UR/UC | 0 | 0 | 0 |  | NO CURRENT |

SEMICONDUCTOR MEMORY CELL AND MEMORY ARRAY USING A BREAKDOWN PHENOMENA IN AN ULTRA-THIN DIELECTRIC

RELATED APPLICATIONS AND PRIORITY CLAIM

This application is a continuation-in-part of pending application Ser. No. 09/955,641 filed Sep. 18, 2001 to Peng entitled "SEMICONDUCTOR MEMORY CELL AND MEMORY ARRAY USING A BREAKDOWN PHENOMENA IN AN ULTRA-THIN DIELECTRIC" and claims priority to that application under 35 U.S.C. §120.

TECHNICAL FIELD OF THE INVENTION

The present invention relates to a nonvolatile programmable semiconductor memory, and more particularly to a nonvolatile programmable semiconductor memory cell that uses a breakdown phenomena in an ultra-thin dielectric such as a MOS gate dielectric to store digital information, and a memory array incorporating such cells.

BACKGROUND OF THE INVENTION

Nonvolatile memory retains stored data when power is removed, which is required or at least highly desirable in many different types of computers and other electronic devices. One commonly available type of nonvolatile memory is the programmable read-only memory ("PROM"), which uses word line—bit line crosspoint elements such as fuses, anti-fuses, and trapped charge devices such as the floating gate avalanche injection metal oxide semiconductor ("FAMOS") transistor to store logical information. PROM typically is not reprogrammable.

An example of one type of PROM cell that uses the breakdown of a silicon dioxide layer in a capacitor to store digital data is disclosed in U.S. Pat. No. 6,215,140, issued Apr. 10, 2001 to Reisinger et al. The basic PROM disclosed by Reisinger et al. uses a series combination of an oxide capacitor and a junction diode as the crosspoint element. An intact capacitor represents the logic value 0, and an electrically broken-down capacitor represents the logic value 1. The thickness of the silicon dioxide layer is adjusted to obtain the desired operation specifications. Silicon dioxide has a breakdown charge of about 10 C/cm$^2$ (Coulomb/cm$^2$). If a voltage of 10 volts is applied to a capacitor dielectric with a thickness of 10 nm (resultant field strength 10 mV/cm), a current of about 1 mA/cm$^2$ flows. With 10 volts, this thus results in a substantial amount of time for programming a memory cell. However, it is more advantageous to design the capacitor dielectric to be thinner, in order to reduce the high power loss which occurs during electrical breakdown. For example, a memory cell configuration having a capacitor dielectric with a thickness of 3 to 4 nm can be operated at about 1.5 V. The capacitor dielectric does not yet break down at this voltage, so that 1.5 V is sufficient to read data from the memory cell. Data are stored, for example, at 5 V, in which case one cell strand in a memory cell configuration can be programmed within about 1 ms. The energy loss which occurs in this case per cm$^2$ of capacitor dielectric is then about 50 Watts (10 Coulomb * 5 V). If the desired power loss is about 0.5 W, about 100 s are required to program a 1 Gigabit memory. If the permissible power losses are higher, the programming can be carried out correspondingly more quickly.

Some types of nonvolatile memory are capable of being repeatedly programmed and erased, including erasable programmable read only semiconductor memory generally known as EPROM, and electrically erasable programmable read only semiconductor memory generally known as EEPROM. EPROM memory is erased by application of ultraviolet light and programmed by application of various voltages, while EEPROM memory is both erased and programmed by application of various voltages. EPROMs and EEPROMs have suitable structures, generally known as floating gates, that are charged or discharged in accordance with data to be stored thereon. The charge on the floating gate establishes the threshold voltage, or $V_T$, of the device, which is sensed when the memory is read to determine the data stored therein. Typically, efforts are made to minimize gate oxide stress in these types of memory cells.

A device known as a metal nitride oxide silicon ("MNOS") device has a channel located in silicon between a source and drain and overlain by a gate structure that includes a silicon dioxide layer, a silicon nitride layer, and an aluminum layer. The MNOS device is switchable between two threshold voltage states $V_{TH(high)}$ and $V_{TH(low)}$ by applying suitable voltage pulses to the gate, which causes electrons to be trapped in the oxide-nitride gate ($V_{TH(high)}$) or driven out of the oxide-nitride gate ($V_{TH(low)}$). Typically, efforts are made to minimize gate oxide stress in these types of memory cells.

A junction breakdown memory cell that uses a stored charge on the gate of a gate controlled diode to store logic 0 and 1 values is disclosed in U.S. Pat. No. 4,037,243, issued Jul. 19, 1977 to Hoffman et al. Charge is stored on the gate by using a capacitance formed between the p-type electrode of the gate controlled diode and the gate electrode. Charge storage is enhanced by using a composite dielectric in the capacitor formed from silicon dioxide and silicon nitride layers in place of silicon dioxide. The application of an erase voltage to the electrode of the gate controlled diode causes the oxide-nitride interface surface to fill with negative charge, which is retained after the erase operation is completed. This negative interface charge causes the gate controlled diode to operate in an induced junction mode even after the erase voltage is removed. When the gate controlled diode is thereafter read, it exhibits field-induced junction breakdown of its channel and a saturation current flows. The field induced junction breakdown voltage is less than metalurgical junction breakdown voltage. However, the application of a write voltage to the electrode of the gate controlled diode causes the silicon dioxide/silicon nitride interface to fill with positive charge, which is retained after the write operation is completed. When the gate controlled diode is thereafter read, it will not break down because no channel exists. Only a slight current flows. The different current flows are sensed and indicate different logic states.

Improvements in the various processes used for fabricating the various types of nonvolatile memory tend to lag improvements in widely used processes such as the advanced CMOS logic process. For example, processes for devices such as Flash EEPROM devices tend to use 30% more mask steps than the standard advanced CMOS logic process to produce the various special regions and structures required for the high voltage generation circuits, the triple well, the floating gate, the ONO layers, and the special source and drain junctions typically found in such devices. Accordingly, processes for Flash devices tend to be one or two generations behind the standard advance CMOS logic process and about 30% more expensive on a cost-per-wafer basis. As another example, processes for antifuses must be suitable for fabricating various antifuse structures and high voltage circuits, and so also tend to be about one generation behind the standard advanced CMOS process.

Generally, great care is taken in the fabrication of the silicon dioxide layer used in metal-oxide-silicon (MOS) devices such as capacitors and transistors. The high degree of care is necessary to ensure that the silicon dioxide layer is not stressed during manufacture or subsequent normal operation of the integrated circuit, so that the desired device characteristics are attained and are stable over time. One example of how much care is taken during fabrication is disclosed in U.S. Pat. No. 5,241,200, issued Aug. 31, 1993 to Kuroda. Kuroda discloses the use of a diffused layer and a shunt to discharge charges accumulated in the word line during a wafer fabrication process. Avoiding this charge accumulation ensures that a large electric field is not applied to the gate insulating film, so that variations in the characteristics of transistors using the word line as their gate wiring line and degradation and breakdown of the gate insulating film are prevented. An example of how much care is taken in circuit design to avoid stressing the silicon dioxide layer of a transistor during normal circuit operation is disclosed in U.S. Pat. No. 6,249,472, issued Jun. 19, 2001 to Tamura et al. Tamura et al. disclose an antifuse circuit having an antifuse in series with a p-channel MOS transistor in one embodiment and in series with an n-channel MOS transistor in another embodiment. While the antifuse is fabricated without the additional film manufacturing processes typically required for fabricating antifuse circuits, Tamura et al. encounter another problem. When the antifuse is shorted out, the series-connected transistor is exposed to a high voltage sufficient to break down the silicon dioxide layer of the transistor. Tamura et al. disclose the addition of another transistor to the circuit to avoid exposing the first transistor to the break down potential.

BRIEF DESCRIPTION OF THE DRAWINGS

FIG. 8 is a table of voltages.

FIG. 9 is a table of voltages.

FIG. 10 is a table of voltages.

DETAILED DESCRIPTION

A semiconductor memory cell having a data storage element constructed around an ultra-thin dielectric, such as a gate oxide, is used to store information by stressing the ultra-thin dielectric into breakdown (soft or hard breakdown) to set the leakage current level of the memory cell. The memory cell is read by sensing the current drawn by the cell. A suitable ultra-thin dielectric is, for example, high quality gate oxide of about 50 Å thickness or less, as is commonly available from presently available advanced CMOS logic processes, for example. Such oxides are commonly formed by deposition, by oxide growth from a silicon active region, or by some combination thereof. Other suitable dielectrics include oxide-nitride-oxide composites, compound oxides, and so forth.

In the following description, numerous specific details are provided to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
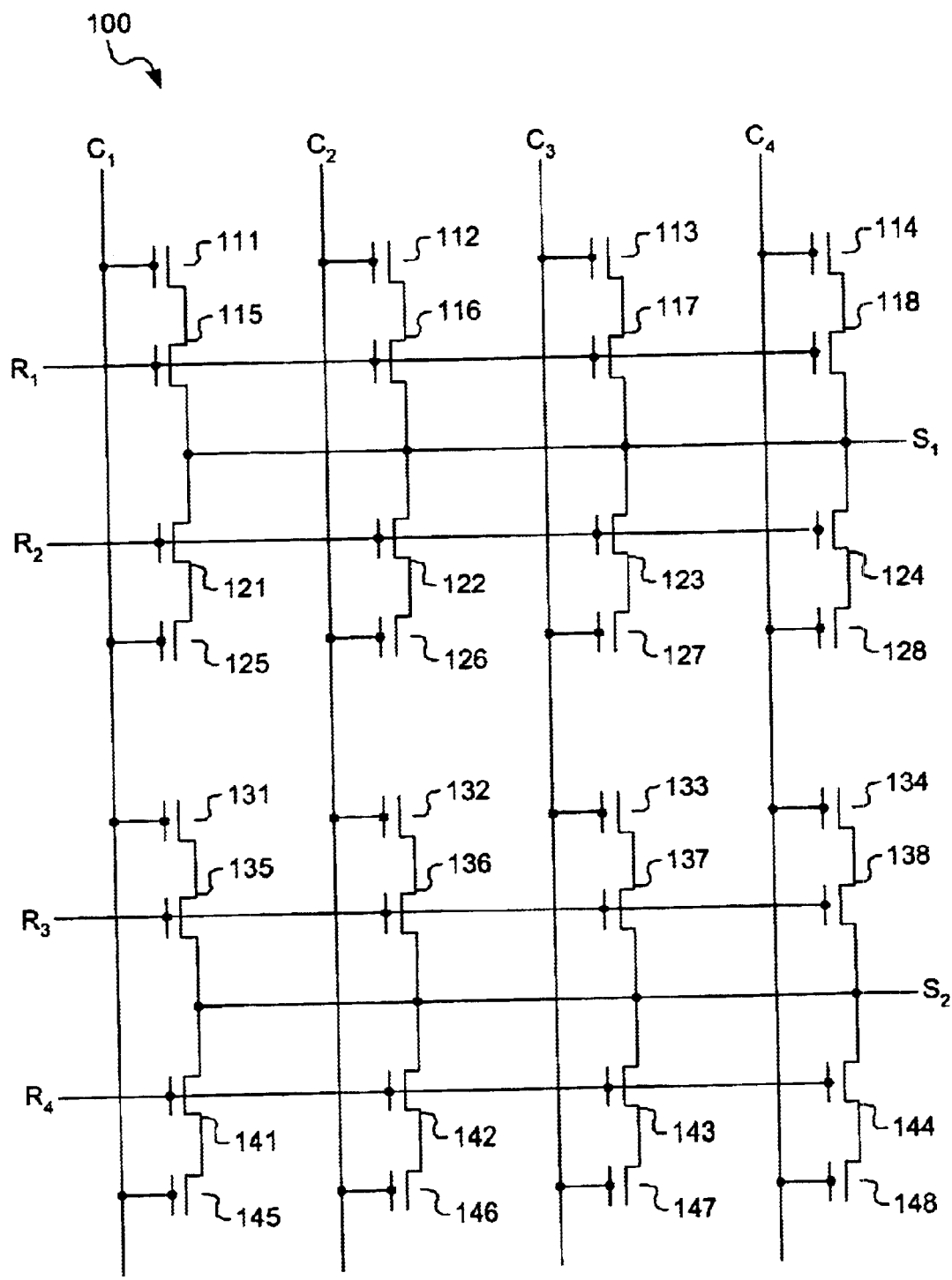
FIG. 1 is a schematic circuit diagram of a portion of a memory array in accordance with the present invention.

An example of an arbitrary 4 by 4 portion of a memory array 100 that includes several such memory cells is shown in the schematic diagram of FIG. 1. FIG. 1 shows 16 memory cells, each of which includes a MOS transistor and a MOS half-transistor. The memory cell at, for example, the crosspoint of the first row $R_1$ and the first column $C_1$ includes an n-channel MOS transistor 115 having its gate connected to the row line $R_1$, its source connected to a source line $S_1$, and its drain connected to one terminal of a MOS half-transistor 111.

The MOS transistor 115 is also referred to herein as a select transistor and is used to "select" a particular memory cell for programming or reading. As will be seen below, during the programming step, a large voltage is applied to the select transistor and MOS half-transistor 111 to break down the gate oxide of the MOS half-transistor 111. However, it is undesirable to break down the gate oxide of the select transistor. Therefore, the gate oxide of the select transistor may be made, in some alternative embodiments, to have a thicker gate oxide than that of the MOS half-transistor 111. Additionally or in the alternative, the select transistor may be replaced by an I/O device that is more resistant to break down.

The gate of the MOS half-transistor 111 is connected to the column line $C_1$. The other memory cells shown in FIG. 1 are formed from half-transistor-transistor pairs 112 and 116, 113 and 117, 114 and 118, 125 and 121, 126 and 122, 127 and 123, 128 and 124, 131 and 135, 132 and 136, 133 and 137, 134 and 138, 145 and 141, 146 and 142, 147 and 143, and 148 and 144.

A MOS half-transistor functions as follows. During programming or read, a positive voltage (for a p-type active region) is applied to the gate, which is one terminal of the capacitor. The gate acts as one plate of the capacitor and also causes an n-type inversion layer to form under the gate. The inversion layer acts as the other plate of the capacitor, and together with the source/drain region forms the second terminal of the capacitor.

The use of half-transistor type data storage elements in the array 100 of FIG. 1 is advantageous because the half-transistors can be fabricated using many conventional MOS and CMOS processes without adding any mask steps to them. However, other types of ultra-thin dielectric data storage elements may be used if desired. For example, a capacitor type data storage element advantageously may be programmed in either direction and has less resistance when the ultra-thin dielectric is stressed, but may require an additional masking step in some processes. Half-transistor type data storage elements are shown in cross-section in FIG. 3, while capacitor type data storage elements are shown in cross-section in FIG. 4.

Although only a 4 by 4 portion of the memory array 100 is shown, in practice such memory arrays contain on the order of about one gigabit of memory cells when fabricated using, for example, an advanced 0.13 μm CMOS logic process, and even larger memories will be realized as CMOS logic processes improve further. The memory 100 in practice is organized into bytes and pages and redundant rows (not shown), which may be done in any desired manner. Many suitable memory organizations are well known in the art.

Figure 2:
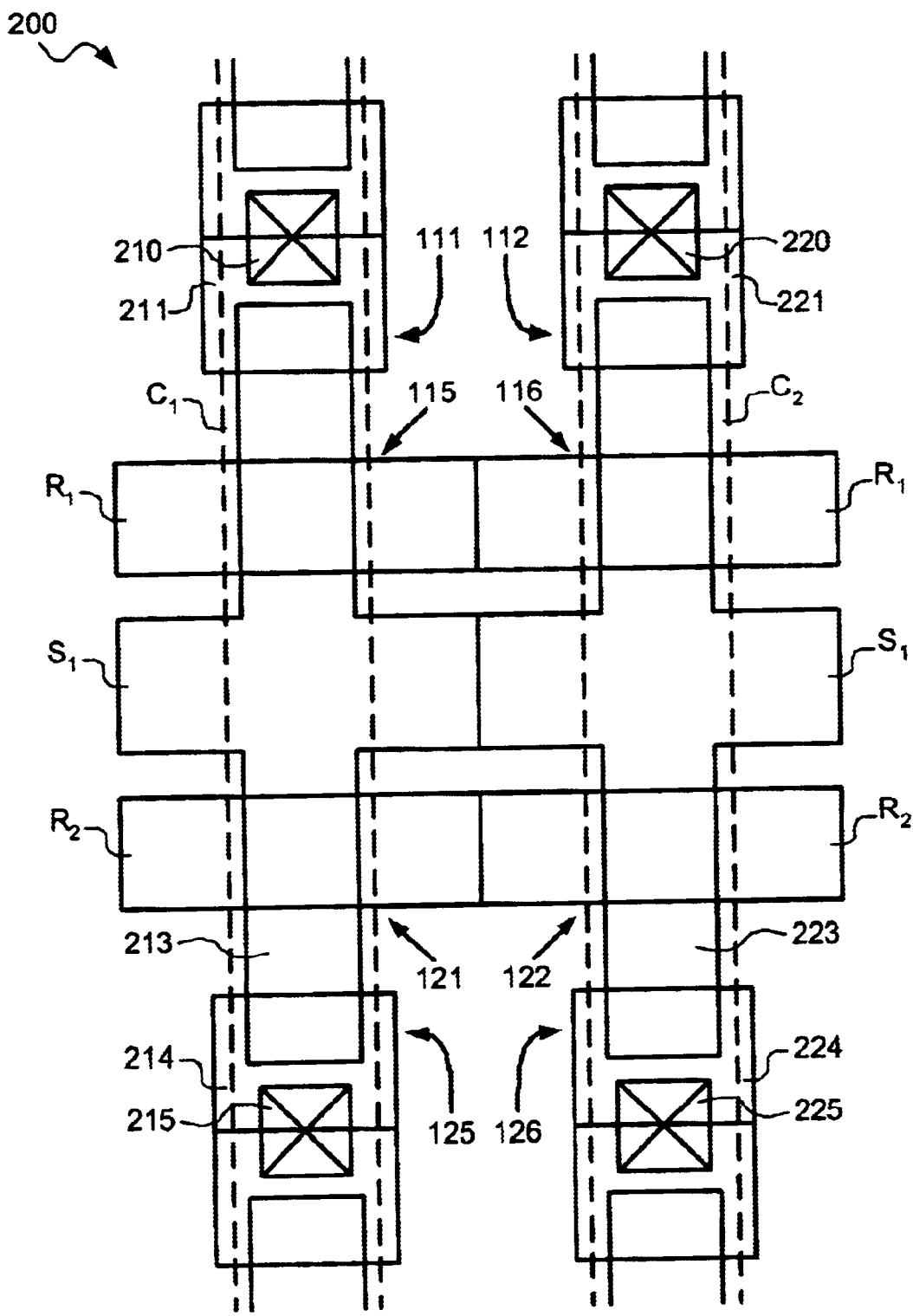
FIG. 2 is a partial layout diagram of a portion of the memory array represented by FIG. 1.
Figure 3:
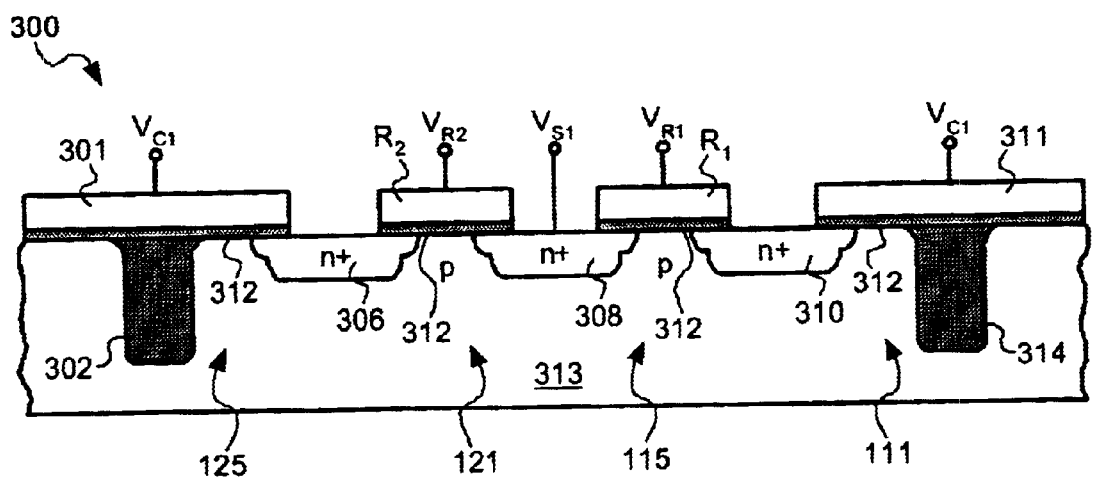
FIG. 3 is a cross-section diagram of an integrated circuit structure for the portion of the memory array corresponding to FIG. 2.

FIG. 2 shows a partial layout diagram 200 for a portion of the memory array 100, and FIG. 3 presents a cross-section of an illustrative MOS integrated circuit 300 showing the principal structure aspects thereof corresponding to the paired memory cells formed by transistor-half transistor pairs 115 and 111 and 121 and 125 in accordance with the layout diagram of FIG. 2. The layout diagram of FIG. 2 is suitable for an advanced CMOS logic process, for example. The term "MOS" literally means metal-oxide-silicon. Although the letter "M" stands for a "metal" gate structure and the letter "O" stands for oxide, the term MOS is commonly understood to pertain to any gate material, including doped polysilicon and other good conductors, as well as to various different types of gate dielectrics not limited to silicon dioxide, and the term is so used herein. For example, the dielectric may be any type of dielectric, such as an oxide or nitride, which undergoes a hard or soft breakdown upon the application of a voltage for a period of time. In one embodiment, a thermally grown gate silicon oxide of about 50 angstroms thick is used.

The memory array 100 preferably is laid out in a grid in which the column lines such as $C_1$ and $C_2$ are orthogonal to the row lines such as $R_1$, $R_2$, $R_3$ and $R_4$ as well as the diffused source lines. An active region mask, containing pattern 213 (FIG. 2), is used to form oxide isolation structures, which include oxide trenches 302 and 314 (FIG. 3), and to define the active regions such as 313 (FIG. 3), which will contain the various transistors, half-transistors, and diffused source lines of the memory array. The MOS half-transistor 111 and the MOS transistor 115 at the crosspoint of the row line $R_1$ and the column line $C_1$ and the MOS half-transistor 125 and the MOS transistor 121 at the crosspoint of the row line $R_2$ and the column line $C_1$ are formed in the p well active region 313 in the following manner.

An ultra-thin gate oxide layer 312 is formed followed by a deposition and doping of polysilicon, which is patterned using a gate mask containing patterns such as 211, 214, 221 and 224 for the gates 311 and 301 of half-transistor 111, 125 (as well as the gates (not shown) of half-transistors 112 and 126 and other half-transistors), and patterns such as $R_1$ and $R_2$ for the row lines $R_1$ and $R_2$, which also serve as gates for the select transistors 115, 121, 116 and 122 (as well as other select transistors). The various source and drain regions are formed by negative lightly doped drain ("NLDD") process steps (implants, spacers, and n+source/drain implants), creating the n+ regions 306, 308 and 310. The region 308 is also part of a diffused source line. A contact mask including patterns 210, 215, 220 and 225 (FIG. 2) is used to form contact vias to the gates 301 and 311 (FIG. 3) and other gates (not shown). A metal mask includes dashed patterns labeled $C_1$ and $C_2$ (FIG. 2) for forming column lines such as $C_1$ and $C_2$, which are orthogonal to the polysilicon row lines such as $R_1$, $R_2$, $R_3$ and $R_4$ as well as the diffused source lines. The other transistor-half transistor pairs in the memory 100 are simultaneously formed in an identical manner.

Figure 4:
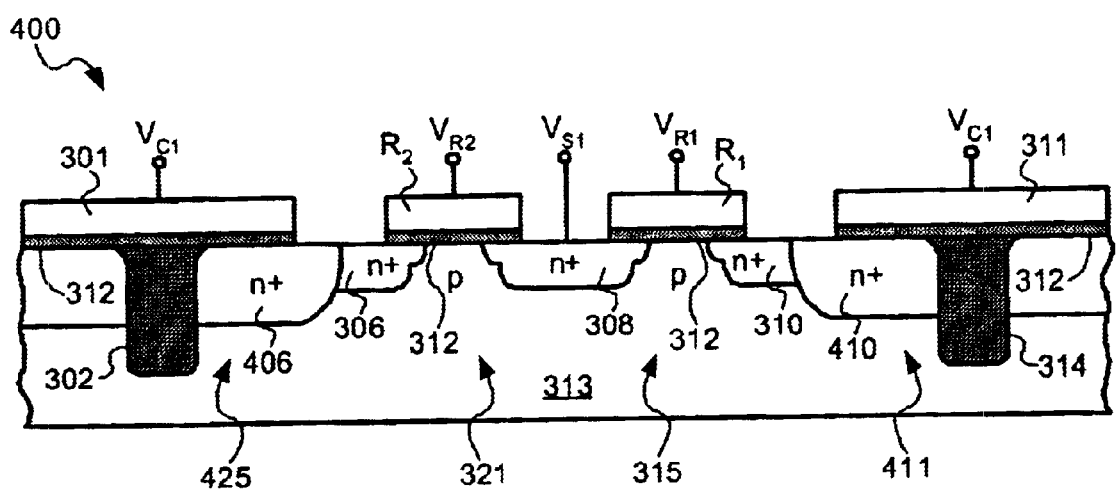
FIG. 4 is a cross-section diagram of a variation of the integrated circuit structure of FIG. 3.

FIG. 4 shows a cross-section of an illustrative MOS integrated circuit 400 showing the principal structural aspects thereof. The cross-section 400 is similar to the cross section 300 of FIG. 3 except that the half transistors 125 and 111 of FIG. 3 are replaced by another type of ultra-thin dielectric data storage element, namely capacitors 425 and 411. The capacitor 411 at the crosspoint of the row line $R_1$ and the column line $C_1$ is formed from the polysilicon gate 311, which is contacted by a metal contact defined by pattern 210, and which overlies the gate oxide 312 and a deeply diffused n+ region 410. Similarly, the MOS capacitor 425 at the crosspoint of the row line $R_2$ and the column line $C_1$ is formed from the polysilicon gate 301, which is contacted by a metal contact defined by the pattern 215, and which overlies the gate oxide 312 and a deeply diffused n+ region 406.

The n+ regions 406 and 410 allow the capacitors 425 and 411 to have very low resistance conductive states relative to the half-transistor 125 and 111 of FIG. 3, which rely on the setting up of an inversion layer to conduct current. Another advantage of the capacitors 425 and 411 is that they can be programmed by flowing current in either direction. A disadvantage of the capacitors 406 and 410 is that they generally require the modification of commercially available processes by the addition of a mask step and/or implantation steps. For example, suitable techniques for forming the n+regions 406 and 410 include the use of buried n+implants prior to the gate polysilicon deposition, or by side implant diffusion after the polysilicon deposition and etch. While the n+ regions 406 and 410 are shown to be more deeply diffused than the doped regions 306 and 310 with which they are integrated, the depth of the diffusion may be varied as desired.

Figure 5:
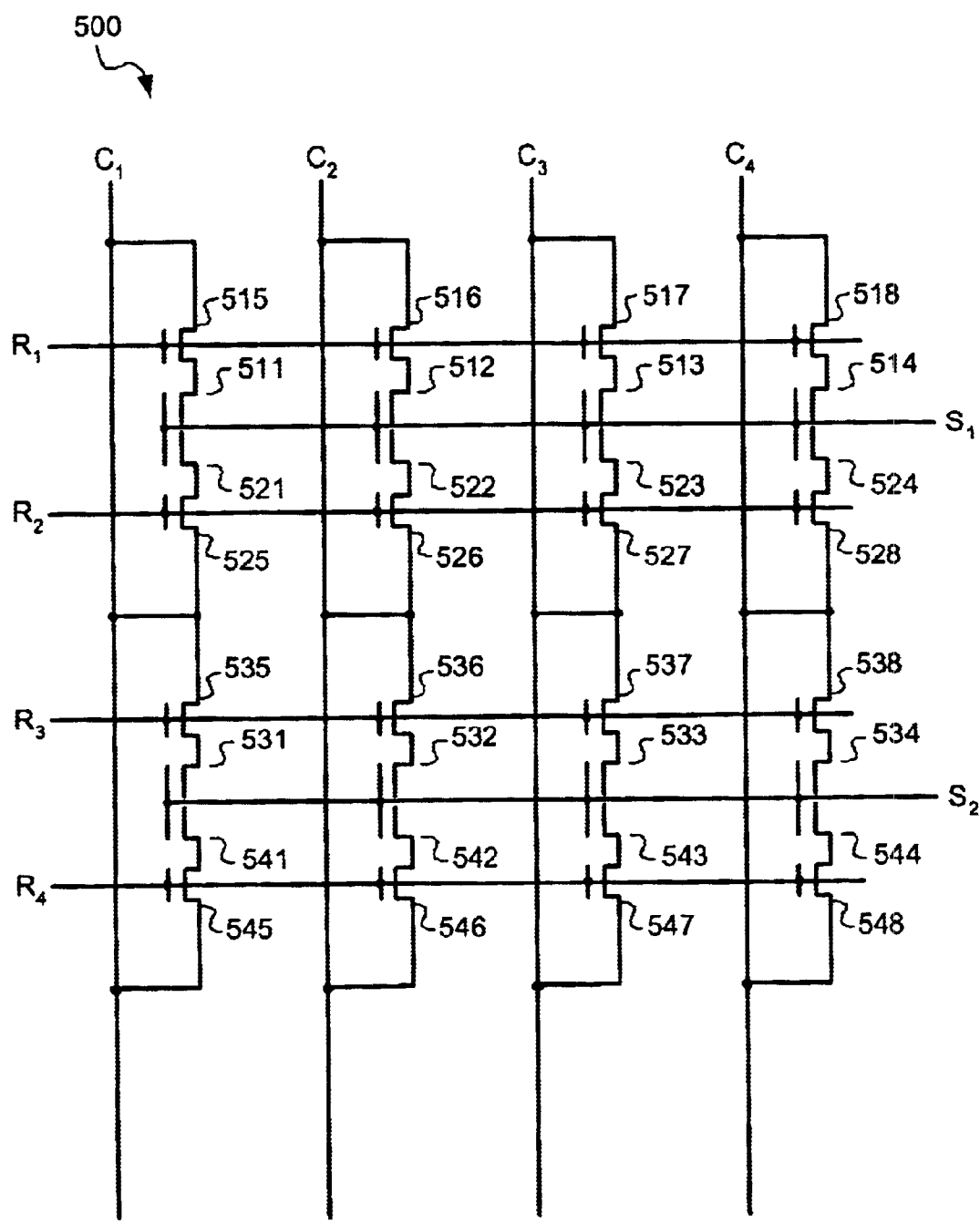
FIG. 5 is a schematic circuit diagram of a portion of another type of memory array in accordance with the present invention.

A variation of the memory array 100 is the memory array 500 shown in FIG. 5, which shows an arbitrary 4 by 4 portion of a larger memory array of memory cells, each of which includes a MOS transistor and a MOS half-transistor. The memory cell at, for example, the crosspoint of the first row $R_1$ and the first column $C_1$ includes a n-channel MOS transistor 515 having its gate connected to the row line $R_1$, its drain connected to the first column $C_1$, and its source connected to one terminal of a MOS half-transistor 511. The gate terminal of the MOS half-transistor 511 is connected to a source line $S_1$. The other memory cells shown in FIG. 1 are formed from similar half transistor-transistor pairs 512 and 516, 513 and 517, 514 and 518, 521 and 525, 522 and 526, 523 and 527, 524 and 528, 531 and 535, 532 and 536, 533 and 537, 534 and 538, 541 and 545, 542 and 546, 543 and 547, and 544 and 548.

As in the case of the memory array of FIG. 1, MOS capacitors may be used instead of MOS half-transistors in the memory array of FIG. 5.

Figure 6:
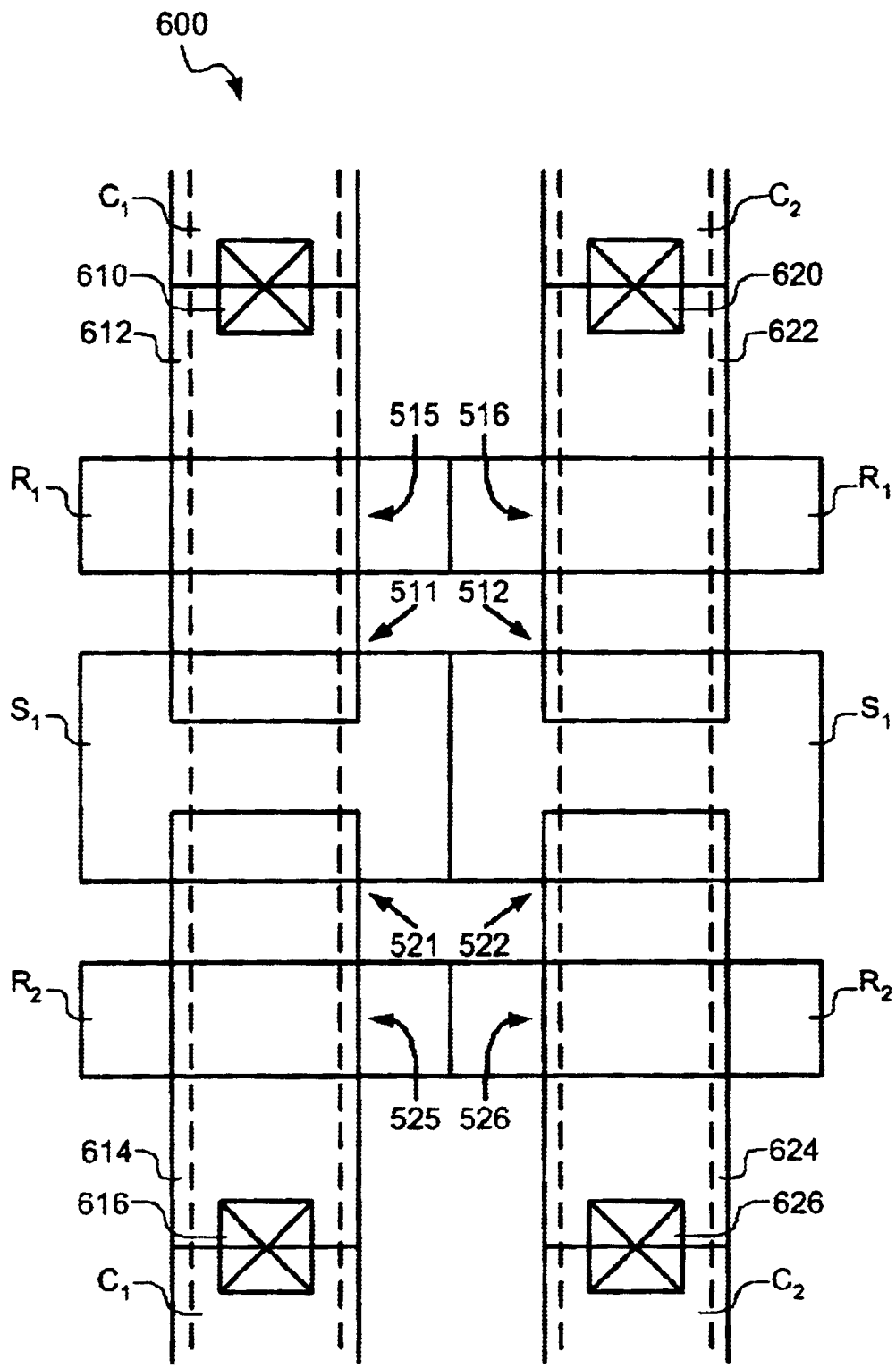
FIG. 6 is a partial layout diagram of a portion of the memory array represented by FIG. 5.
Figure 7:
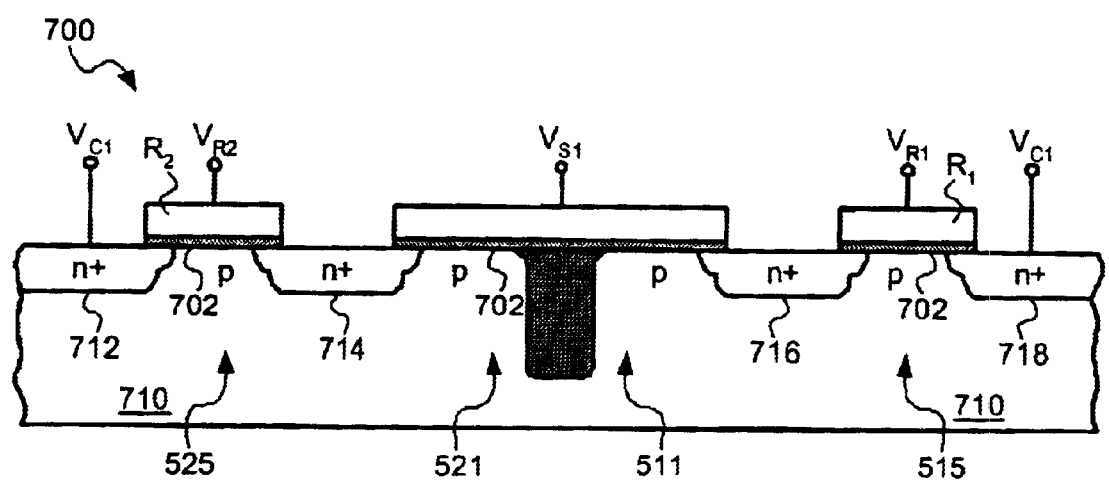
FIG. 7 is a cross-section diagram of an integrated circuit structure for the portion of the memory array corresponding to FIG. 6.

FIG. 6 shows a partial layout diagram 600 for a portion of the memory array 500, and FIG. 7 presents a cross-section of an illustrative MOS integrated circuit 700 showing the principal structure aspects thereof corresponding to the paired memory cells formed by transistor-half transistor pairs 515 and 511, and 525 and 521 in accordance with the layout diagram of FIG. 5. The layout diagram of FIG. 6 is suitable for an advanced CMOS logic process, for example. The memory array 500 preferably is laid out in a grid in which the column lines such as $C_1$ and $C_2$ are orthogonal to the row lines such as $R_1$, $R_2$, $R_3$ and $R_4$ as well as source lines such as S1. An n+ diffusion and active region mask containing patterns 612, 614, 622 and 624 (FIG. 6) is used to form oxide isolation structures, which include oxide trench 704 (FIG. 7), and to define the active regions such as 710 (FIG. 7), which will contain the various transistors and half-transistors of the memory array. The MOS half-transistor 511 and the MOS transistor 515 at the crosspoint of the row line $R_1$ and the column line $C_1$ and the MOS half-transistor 521 and the MOS transistor 525 at the crosspoint of the row line $R_2$ and the column line $C_1$ are formed in the p well active region 710 in the following manner. An ultra-thin gate oxide layer 702 is formed followed by a deposition and doping of polysilicon, which is patterned using a gate mask containing patterns such as $R_1$, $S_1$ and $R_2$ which serve as gates for the select transistors 515, 525, 516 and 526 and for the half-transistors 511, 521, 512 and 522. The various source and drain regions are formed by negative lightly doped drain ("NLDD") process steps (implants, spacers, and n+source/drain implants), creating the n+ regions 712, 714, 716 and 718 (FIG. 7). A contact mask including patterns 610, 616, 620 and 626 (FIG. 6) is used to form contact vias to the drains 712 and 718 (FIG. 7) as well as to other drains (not shown). A metal mask includes dashed patterns labeled $C_1$ and $C_2$ (FIG. 6) for forming column lines such as $C_1$ and $C_2$, which are orthogonal to the polysilicon row lines such as $R_1$, $R_2$, $R_3$ and $R_4$ as well as the polysilicon source lines such as $S_1$. The other transistor-half transistor pairs in the memory 500 are simultaneously formed in an identical manner.

The operation of the memory array 100 is now explained with reference to the illustrative voltages shown in FIG. 8. It will be appreciated that the voltages are illustrative, and that different voltages are likely to be used in different applications or when different process technologies are used. During programming, the various memory cells in the memory array 100 are exposed to one of four possible voltage combinations, which are shown on lines 801, 802, 803 and 804 of FIG. 8. Read voltages are shown on lines 805, 806, 807 and 808.

Assume that the selected row and column ("SR/SC") is $R_1$ and $C_1$, which is intended to program the memory cell formed by transistor 115 and half-transistor 111. As shown on line 801, the voltage on the row line $R_1$ is 2.5 volts and the voltage on the source line $S_1$ is 0 volts, which is sufficient to turn on the transistor 115 and bring the drain of transistor 115 to zero volts. The voltage on the column line $C_1$ is 7.0 volts, which causes a potential difference of 7 volts across the half-transistor 111. The gate oxide 212 in the half-transistor 111 is designed to break down at this potential difference, which programs the memory cell. When the half-transistor 111 breaks down, the resulting conductive path has sufficient resistivity to prevent the gate oxide 212 of the transistor 115 from becoming degraded or breaking down. As one example, in some devices, the channel resistance of the transistor 115 is on the order of about 10 K$\Omega$ while the resistance of the broken down oxide is on the order of greater than about 100 K$\Omega$.

With $R_1$ and $C_1$ being the selected row and column, consider the impact on the memory cell formed by transistor 116 and half-transistor 112, which is at the crosspoint of a selected row and unselected column ("SR/UC"). As shown on line 802, the voltage on the row line $R_1$ is 2.5 volts and the voltage on the source line $S_1$ is 0 volts, which is sufficient to turn on the transistor 116 and bring the drain of transistor 115 to zero volts. However, the voltage on the column line $C_2$ is 0 volts, which causes a potential difference of 0 volts across the half-transistor 112. The memory cell does not program.

With $R_1$ and $C_1$ being the selected row and column, consider the impact on the memory cell formed by transistor 121 and half-transistor 125, which is at the crosspoint of an unselected row and a selected column ("UR/SC"). As shown on line 803, the voltage on the row line $R_2$ is 0 volts and the voltage on the source line $S_1$ is 0 volts, so that the transistor 121 does not turn on and the node between the drain of the transistor 121 and the half-transistor 125 floats. The voltage on the column line $C_1$ is 7.0 volts, which causes a potential difference of less than about 4 volts across the half-transistor 125. The memory cell does not program, and the potential difference of less than about 4 volts without any current flow is not sufficient to damage or degrade the gate oxide in either the half-transistor 125 or the transistor 121.

With $R_1$ and $C_1$ being the selected row and column, consider the impact on the memory cell formed by transistor 122 and half-transistor 126, which is at the crosspoint of an unselected row and an unselected column ("UR/UC"). As shown on line 804, the voltage on the row line $R_2$ is 0 volts and the voltage on the source line $S_1$ is 0 volts, so that the transistor 122 does not turn on. The voltage on the column line $C_2$ also is 0 volts, so that no potential difference develops across the half-transistor 126. The memory cell does not program.

The memory array 100 is read in the following manner. A read select voltage of 2.5 volts is placed on the selected row ("SR") and a read column select voltage of 1.5 volts is placed on the selected column ("SC"). All other rows, which are unselected rows ("UR"), and all other columns, which are unselected columns ("UC"), are set at 0 volts. Assume that $R_1$ and $C_1$ are the selected row and column ("SR/SC") and that the memory cell formed by the transistor 115 and the half-transistor 111 is programmed. As shown on line 805, 2.5 volts (a read select voltage) are applied via row line $R_1$ to the gate of the transistor 115 and 0 volts are applied to the source via the source line $S_1$, causing current to be drawn from the column line $C_1$, which is at 1.5 volts, to indicate that the memory cell is programmed. If the memory cell is not programmed, no current would flow to indicate that the memory cell is not programmed.

No current is drawn by memory cells at crosspoints having either an unselected row or an unselected column. As shown on line 806 for the case of a selected row line and an unselected column line, 2.5 volts are applied to the gate of the transistor in the memory cell, but as 0 volts are present on the column line, no current flows. As shown on line 807 for the case of an unselected row line and a selected column line, 0 volts are applied to the gate of the transistor in the memory cell. Although 1.5 volts are present on the column line, no current flows because the transistor remains off. As shown on line 808 for the case of an unselected row line and an unselected column line, 0 volts are applied to the gate of the transistor in the memory cell and 0 volts are present on the column line, so no current flows.

The operation of the memory array 500 is now explained with reference to the voltages shown in FIGS. 9 and 10. These voltages are illustrative, and different voltages are likely to be used in different applications or when different process technologies are used. It will also be appreciated that while the voltages listed in the tables of FIGS. 8, 9 and 10 are different, the principle behind the various voltages is the same and is suggestive of the breadth of useful voltages.

Consider first the illustrative programming voltages listed in the table of FIG. 9. These voltages are appropriate where the half-transistor contains an ultra-thin gate oxide but the select transistors are input/output type devices having a gate oxide thickness greater than 50 Å. During programming, the various memory cells in the memory array 500 are exposed to one of four possible voltage combinations, which are shown on lines 901, 902, 903 and 904 of FIG. 9. Common to all voltage combinations is the value of the source line $S_1$ voltage, which is 0 volts.

Assume that the selected row and column ("SR/SC") is $R_1$ and $C_1$, which is intended to program the memory cell formed by transistor 515 and half-transistor 511. As shown on line 901, the voltage on the row line $R_1$ is 7.0 volts and the voltage on the column line $C_1$ is 7.0 volts, which places 7.0 volts on the gate and drain and is sufficient to turn on the transistor 515. The source of transistor 515 is brought to 7.0 volts less a slight voltage drop across the transistor 515, which causes a potential difference of 6.6 volts across the half-transistor 511. The gate oxide 712 in the half-transistor 511 is designed to break down at this potential difference, which programs the memory cell. When the half-transistor 511 breaks down, the resulting conductive path has sufficient resistivity to prevent the gate oxide 712 of the transistor 515 from becoming degraded or breaking down.

With $R_1$ and $C_1$ being the selected row and column, consider the impact on the memory cell formed by transistor 516 and half-transistor 512, which is at the crosspoint of a selected row and an unselected column ("SR/UC"). As shown on line 902, the voltage on the row line $R_1$ is 7.0 volts and the voltage on the column line $C_1$ is 0 volts, which places 7.0 volts on the gate and is sufficient to turn on the transistor 516 and bring the source of transistor 516 to about the voltage on the column line $C_2$, which is zero volts. Since the potential difference across the half-transistor 512 is about 0 volts, the memory cell does not program.

With $R_1$ and $C_1$ being the selected row and column, consider the impact on the memory cell formed by transistor 525 and half-transistor 521, which is at the crosspoint of an unselected row and a selected column ("UR/SC"). As shown on line 903, the voltage on the row line $R_2$ is 0 volts and the voltage on the column line $C_1$ is 7.0 volts, which places 0 volts on the gate and 7.0 volts on the drain. The transistor 525 does not turn on, although the 7.0 voltage difference between the potential on the drain and the potential on the source line $S_1$ approximately divides between the transistor 525 and the half-transistor 125 and causes less than 4 volts to appear across the oxide of the half-transistor 521. The memory cell does not program, and the potential difference of less than about 4 volts without any current flow is not sufficient to damage or degrade the gate oxide in either the half-transistor 521 or the transistor 525.

With $R_1$ and $C_1$ being the selected row and column, consider the impact on the memory cell formed by transistor 526 and half-transistor 522, which is at the crosspoint of an unselected row and an unselected column ("UR/UC"). As shown on line 904, the voltage on the row line $R_2$ is 0 volts and the voltage on the drain line $C_2$ is 0 volts, so that the transistor 526 does not turn on. The voltage on the source line $S_1$ also is 0 volts, so that no potential difference develops across the half-transistor 522. The memory cell does not program.

Consider next the illustrative programming voltages listed in the table of FIG. 10. These voltages are appropriate where both the half-transistors and the select transistors contain an ultra-thin gate oxide. During programming, the various memory cells in the memory array 500 are exposed to one of four possible voltage combinations, which are shown on lines 1001, 1002, 1003 and 1004 of FIG. 10. Common to all voltage combinations is the value of the source line $S_1$ voltage, which is minus 4.5 volts.

Assume that the selected row and column ("SR/SC") is $R_1$ and $C_1$, which is intended to program the memory cell formed by transistor 515 and half-transistor 511. As shown on line 1001, the voltage on the row line $R_1$ is 2.5 volts and the voltage on the column line $C_1$ is 2.5 volts, which places 2.5 volts on the gate and drain and is sufficient to turn on the transistor 515. The source of transistor 515 is brought to 2.5 volts less a slight voltage drop across the transistor 515, which causes a potential difference of 6.6 volts across the half-transistor 511. The gate oxide 712 in the half-transistor 511 is designed to break down at this potential difference, which programs the memory cell. When the half-transistor 511 breaks down, the resulting conductive path has sufficient resistivity to prevent the gate oxide 712 of the transistor 515 from becoming degraded or breaking down.

With $R_1$ and $C_1$ being the selected row and column, consider the impact on the memory cell formed by transistor 516 and half-transistor 512, which is at the crosspoint of a selected row and an unselected column ("SR/UC"). As shown on line 1002, the voltage on the row line $R_1$ is 2.5 volts and the voltage on the column line $C_1$ is 0 volts, which places 2.5 volts on the gate and is sufficient to turn on the transistor 516 and bring the source of transistor 516 to about the voltage on the column line $C_2$, which is zero volts. Since the potential difference across the half-transistor 512 is about 4.0 volts, the memory cell does not program.

With $R_1$ and $C_1$ being the selected row and column, consider the impact on the memory cell formed by transistor 525 and half-transistor 521, which is at the crosspoint of an unselected row and a selected column ("UR/SC"). As shown on line 1003, the voltage on the row line $R_2$ is 0 volts and the voltage on the column line $C_1$ is 2.5 volts, which places 0 volts on the gate and 2.5 volts on the drain. The transistor 525 does not turn on, although the 6.5 volt difference between the potential on the drain and the potential on the source line $S_1$ approximately divides between the transistor 525 and the half-transistor 125 and causes less than about 4 volts to appear across the oxide of the half-transistor 521. The memory cell does not program, and the potential difference of less than about 4 volts without any current flow is not sufficient to damage or degrade the gate oxide in either the half-transistor 521 or the transistor 525.

With $R_1$ and $C_1$ being the selected row and column, consider the impact on the memory cell formed by transistor 526 and half-transistor 522, which is at the crosspoint of an unselected row and an unselected column ("UR/UC"). As shown on line 1004, the voltage on the row line $R_2$ is 0 volts and the voltage on the drain line $C_2$ is 0 volts, so that the transistor 526 does not turn on. Since the voltage on the source line $S_1$ is minus 4.5 volts, the potential difference that develop across the half-transistor 522 is less than about 4 volts. The memory cell does not program, and the potential difference of less than about 4 volts without any current flow is not sufficient to damage or degrade the gate oxide in either the half-transistor 522 or the transistor 526.

Regardless of whether the programming voltages of the table of FIG. 9 or the table of FIG. 10 are used, the memory array 500 is read in the following manner. A read select voltage of 2.5 volts is placed on the selected row ("SR") and a read column select voltage of 1.5 volts is placed on the selected column ("SC"). All other rows, which are unselected rows ("UR"), and all other columns, which are unselected columns ("UC"), are set at 0 volts. Assume that $R_1$ and $C_1$ are the selected row and column ("SR/SC") and that the memory cell formed by the transistor 515 and the half-transistor 511 is programmed. As shown on lines 905 and 1005, 2.5 volts (a read select voltage) are applied via row line $R_1$ to the gate of the transistor 515 and 1.5 volts are applied to the drain via the column line $C_1$, causing current to be drawn from the column line $C_1$ to indicate that the memory cell is programmed. If the memory cell is not programmed, no current would flow to indicate that the memory cell is not programmed.

No current is drawn by memory cells at crosspoints having either an unselected row or an unselected column. As shown on lines 906 and 1006 for the case of a selected row line and an unselected column line, 2.5 volts are applied to the gate of the transistor in the memory cell, but as 0 volts are present on the column line, no current flows. As shown on lines 907 and 1007 for the case of an unselected row line and a selected column line, 0 volts are applied to the gate of the transistor in the memory cell. Although 1.5 volts are present on the column line, no current flows because the transistor remains off. As shown on lines 908 and 1008 for the case of an unselected row line and an unselected column line, 0 volts are applied to the gate of the transistor in the memory cell and 0 volts are present on the column line, so no current flows.

The design of the memory cells and arrays described above and shown in FIGS. 1–10 provide a significant advantage of cost and performance over prior art memory cells. However, as seen above, during programming, a relatively large programming voltage (typically 6 or more) is applied to the oxide of the half transistor. For those rows that are not selected for programming, i.e., the select transistors for unprogrammed cells, a relatively large voltage will be present across the oxide of the select transistors not programmed if the cell has been previously programmed. This may damage (breakdown) the oxide of those select transistors. In order to combat this problem, a thicker gate oxide for the select transistor (on the order of 70 angstroms) may be used. However, the use of a thicker gate oxide results in a larger cell size for the memory cell.

Figure 17:
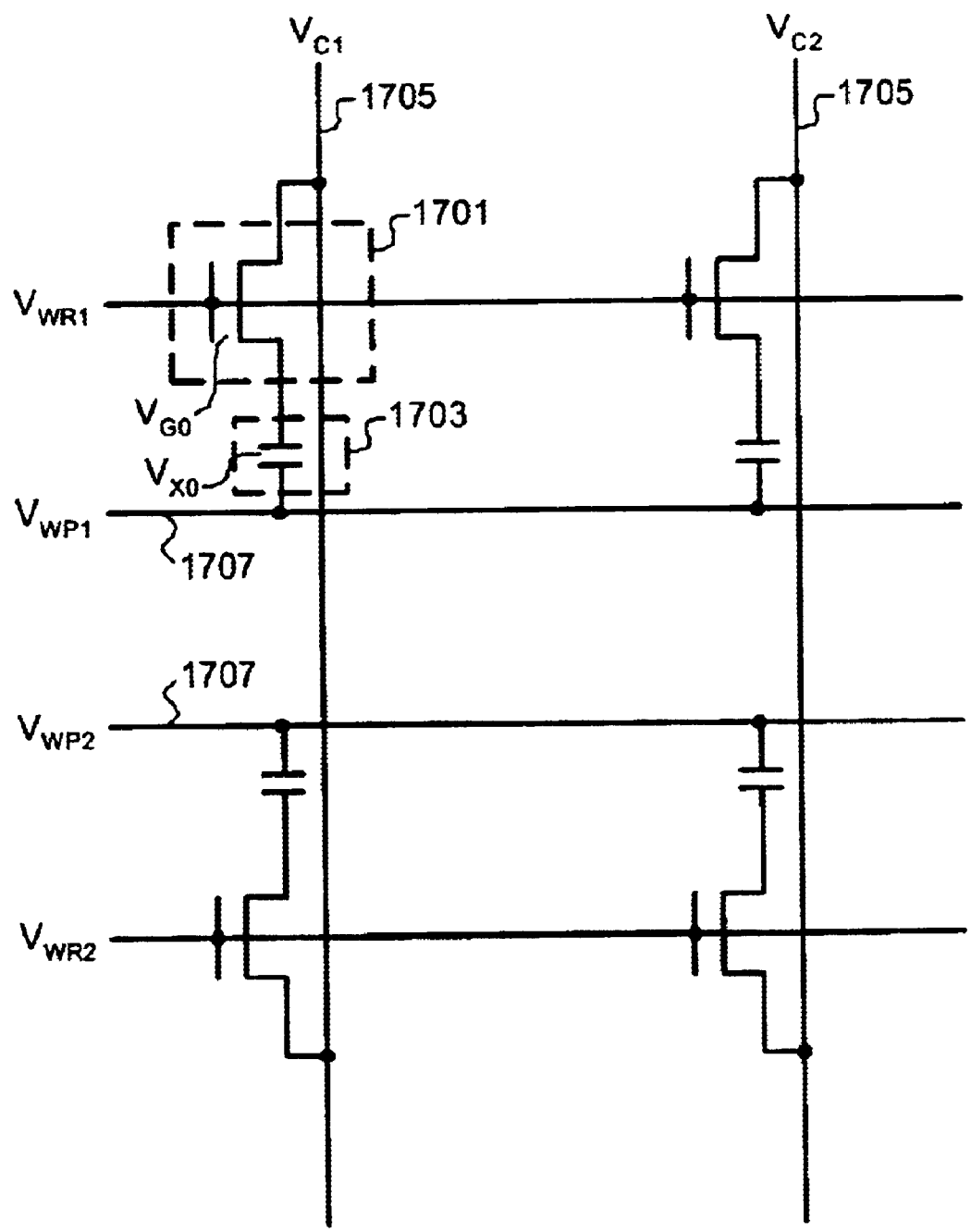
FIG. 17 is a schematic circuit diagram of a portion of a memory array in accordance with an alternative embodiment of the present invention.
Figure 18:
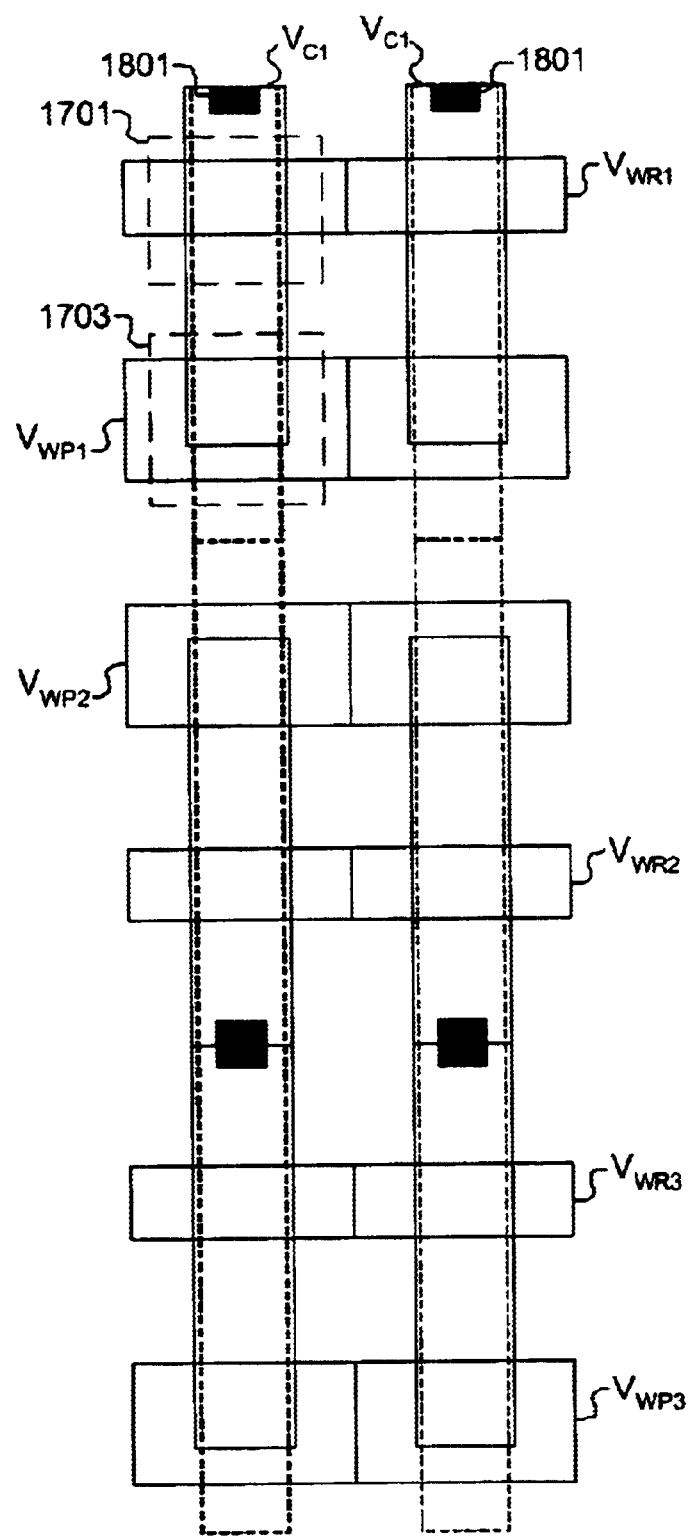
FIG. 18 is a partial layout diagram of a portion of the memory array represented by FIG. 17.

By modifying the layout and programming voltages, the issues raised above may be resolved. Specifically, in an alternative embodiment described below, the gate oxide of the select transistor may also be made to be an ultra-thin dielectric, same as the half-transistor storage element. This is because the select transistors of unselected memory cells do not experience a high voltage across the gate oxide. Turning to FIGS. 17 and 18, a schematic view and top layout view of an alternative embodiment of the present invention can be seen. In this embodiment, a select transistor 1701 is controlled by a signal $V_{WR1}$ (the subscript referring to "Wordline Read No. 1"). Other rows of memory cells have their select transistors controlled by signals $V_{WRN}$, where N varies from 1 to N (the total number of rows in the memory array). The signals $V_{WRN}$ are carried on what are also referred to as row select lines.

The source of the select transistor 1701 is connected to a column select line 1705 that provides a voltage $V_{C1}$. Other columns of memory cells have the sources of the select transistors controlled by signals $V_{CM}$, where M varies from 1 to M (the total number of columns in the memory array).

The drain of the select transistor 1701 is connected to one terminal of a capacitor 1703. In one embodiment, the capacitor 1703 is a MOS capacitor formed by an implant region, a gate oxide, and a polysilicon layer. In one embodiment, the drain of the select transistor 1701 is connected to the implant region of the MOS capacitor 1703. The gate oxide of the capacitor is used as the storage element, e.g., the gate oxide can be selectively broken down for programming as described in detail above. The polysilicon layer of the MOS capacitor 1703 is connected to a programming line 1707 that provides a voltage $V_{WP1}$. Other rows of memory cells have the polysilicon layer of the MOS capacitor 1703 connected to signals $V_{WPN}$, where N varies from 1 to N (the total number of rows in the memory array). The signals $V_{WPN}$ are carried on what are also referred to as row program lines.

The top layout view of the memory array can be seen in FIG. 18. In this tope view, six memory cells are shown. Like structures are designated with like numbers in both FIGS. 17 and 18. Thus, the select transistor 1701 in FIG. 18 is shown as a polysilicon layer ($V_{WR1}$) formed between source and drain implants. FIG. 18 also shows contacts 1801 that connect the source of the select transistor 1701 to a column select line.

The operation of the memory cell of FIGS. 17 and 18 is now explained with reference to the illustrative voltages shown in the table below:

|  |  | $V_C$ | $V_{WP}$ | $V_{WR}$ | $V_{XO}$ | $V_{GO}$ | Program |
|---|---|---|---|---|---|---|---|
| Program | SC/SR | 0 | 5.5 | 2 | 5.5 | 2 | Yes |
|  | SC/UR | 0 | 0 | 0 | 0 | 0 | No |
|  | UC/SR | 2 | 5.5 | 2 | 3.5 | 0 | No |
|  | UC/UR | 2 | 0 | 0 | 0 | 2 | No Sense Current |
| Read | SC/SR | 1.2 | 0 | 1.2 |  |  | Yes |
|  | SC/UR | 1.2 | 0 | 0 |  |  | No |
|  | UC/SR | 0 | 0 | 0 |  |  | No |
|  | UC/UR | 0 | 0 | 0 |  |  | No |

It will be appreciated that the voltages are illustrative, and that different voltages are likely to be used in different applications or when different process technologies are used. During programming, the various memory cells in the memory array are exposed to one of four possible voltage combinations, which correspond to: (1) the cell that is the intersection of the Selected Column (SC) and Selected Row (SR); (2) the cells that are not in the selected column (referred to as unselected column or "UC"), but are in the selected row; (3) the cells that are not in the selected row (referred to as unselected row or "UR"), but are in the selected column; and (4) the cells that are not in the selected row and not in the selected column.

For the cell in the selected row and column ("SR/SC"), the voltage on the row line $V_{WR}$ is 2 volts, the voltage on the column select line $V_C$ is 0 volts, and the voltage on the programming line $V_{WP}$ 5.5 volts. This causes a potential difference ($V_{XO}$) of 5.5 across the oxide of the capacitor 1703. The capacitor oxide in the capacitor is designed to break down at this potential difference, which programs the memory cell. Further, the voltage across the oxide of the select transistor, designated as $V_{GO}$ has a maximum of 2 volts. This prevents breakdown of the oxide of the select transistor.

Next, we consider the impact on a memory cell that is at the crosspoint of a selected row and unselected column ("SR/UC"). As shown in the table above, the voltage on the row line $V_{WR}$ is 2 volts, the voltage on the column select line $V_C$ is 2 volts, and the voltage on the programming line $V_{WP}$ 5.5 volts. This will result in a voltage $V_{XO}$ of 3.5 volts across the oxide of the capacitor. This will not break down the oxide, and thus, the cell is not programmed. Further, the maximum voltage $V_{GO}$ across the oxide of the select transistor is 2 volts. This allows for the use of a ultra thin gate oxide for the select transistor.

Next, consider the impact on the memory cell that is at the crosspoint of an unselected row and a selected column ("UR/SC"). As shown in the table above, the voltage on the row line $V_{WR}$ is 0 volts, the voltage on the column select line $V_C$ is 0 volts, and the voltage on the programming line $V_{WP}$ 0 volts. This will result in a voltage $V_{XO}$ of 0 volts across the oxide of the capacitor. This will not break down the oxide, and thus, the cell is not programmed. Further, there is no voltage $V_{GO}$ across the oxide of the select transistor. Again, this allows for the use of an ultra thin gate oxide for the select transistor.

Next, consider the impact on the memory cell that is at the crosspoint of an unselected row and an unselected column ("UR/UC"). As shown in the table above, the voltage on the row line $V_{WR}$ is 0 volts, the voltage on the column select line $V_C$ is 2 volts, and the voltage on the programming line $V_{WP}$ o volts. This will result in a voltage $V_{XO}$ of 0 volts across the oxide of the capacitor. This will not break down the oxide, and thus, the cell is not programmed. Further, the maximum voltage $V_{GO}$ across the oxide of the select transistor is 2 volts. Again, this allows for the use of an ultra thin gate oxide for the select transistor.

The memory can be read in the following manner. A read select voltage of 1.2 volts is placed on the selected row ("SR") and a read column select voltage of 1.2 volts is placed on the selected column ("SC"). All other rows, which are unselected rows ("UR"), and all other columns, which are unselected columns ("UC"), are set at 0 volts. Assume that the memory cell at the crosspoint of the selected column and selected row is programmed. A 1.2 volts (a read select voltage) is applied via row line $V_{WR}$ to the gate of the select transistor 1701 and 1.2 volts is applied to the source via the column line $V_C$. If the cell is programmed, current would be drawn from the column line $V_C$, which is at 1.2 volts. If the memory cell is not programmed, no current would flow to indicate that the memory cell is not programmed.

Various studies of oxide breakdown, which were performed in contexts different than the memory cells shown in the arrays 100 (FIG. 1) and 500 (FIG. 5), indicate suitable voltage levels for breaking down ultra-thin gate oxides and establishing that the breakdown is controllable. When an ultra-thin gate oxide is exposed to voltage-induced stress, breakdown in the gate oxide occurs. Although the actual mechanisms leading to the intrinsic breakdown of gate oxide are not well understood, the breakdown process is a progressive process passing through a soft breakdown ("SBD") stage followed by a hard breakdown ("HBD") stage. One cause of breakdown is believed to be oxide defect sites. These may act alone to cause breakdown, or may trap charges and thereby cause high local fields and currents and a positive feedback condition that leads to thermal runaway. Improved fabrication processes resulting in fewer oxide defects are reducing the occurrence of this type of breakdown. Another cause of breakdown is believed to be electron and hole trapping at various sites even in defect-free oxide, which also leads to thermal runaway.

Figure 11:
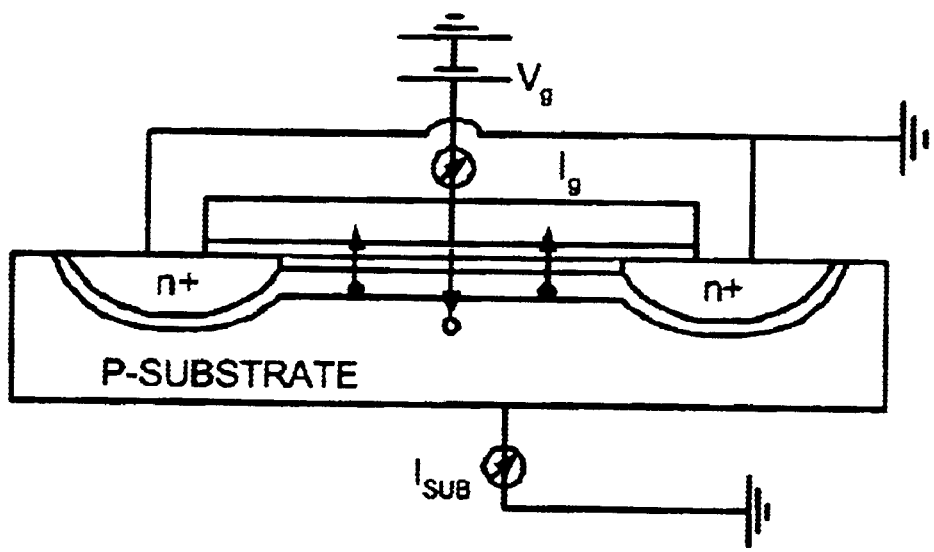
FIG. 11 is a cross-section diagram of an experimental setup.
Figure 12:
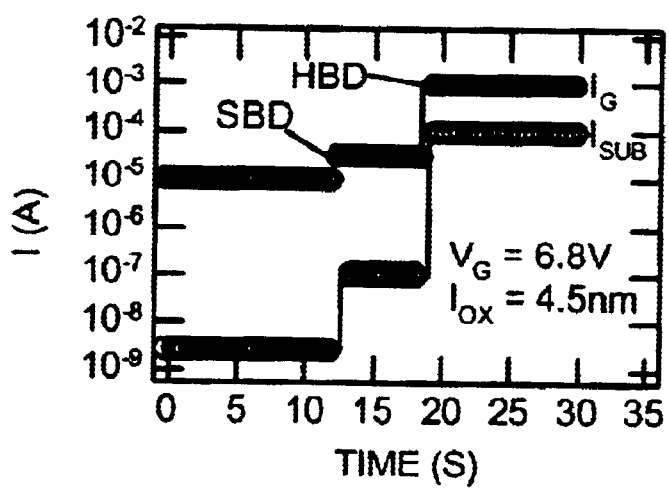
FIG. 12 is a graph showing the effect of a constant voltage stress on an ultra-thin gate oxide

Rasras et al. performed a carrier separation experiment which demonstrated that, under positive gate bias, impact ionization of the electrons in the substrate is the dominant source of the substrate hole current. Mahmoud Rasras, Ingrid De Wolf, Guido Groeseneken, Robin Degraeve, Herman e. Maes, Substrate Hole Current Origin after Oxide Breakdown, IEDM 00-537, 2000. A constant voltage stress experiment was performed on ultra-thin oxide in an arrangement in which channel inversion was involved, and established that both SBD and HBD may be used for storing data, and that a desired degree of SBD or HBD may be obtained by controlling the time over which the gate oxide storage element is stressed. FIG. 11 shows a schematic cross-sectional representation of the experimental setup. The effect of the constant voltage stress on the ultra-thin gate oxide is shown in the graph of FIG. 12, in which the x-axis is time in seconds and the y-axis is current in amperes expressed logarithmically. FIG. 12 shows the gate and substrate hole current measured before and after soft and hard breakdown under constant voltage stress. For roughly 12.5 seconds, the total current is substantially constant and dominated by an electron current as measured by $I_g$. The leakage is believed to be due to Fowler-Nordheim ("FN") tunneling and stress-induced leakage current ("SILC"). At about 12.5 seconds, a large jump in the measured substrate hole current is observed, which signals the onset of a soft breakdown ("SBD"). The total current remains substantially constant at this new level, albeit with some fluctuation in the substrate current, from about 12.5 seconds to about 19 seconds. At about 19 seconds, large jumps in both the electron current and the substrate hole current signal the onset of hard breakdown ("HBD"). FIG. 10 shows that a desired degree of SBD or HBD may be obtained by controlling the time over which the gate oxide storage element is stressed.

Figure 13:
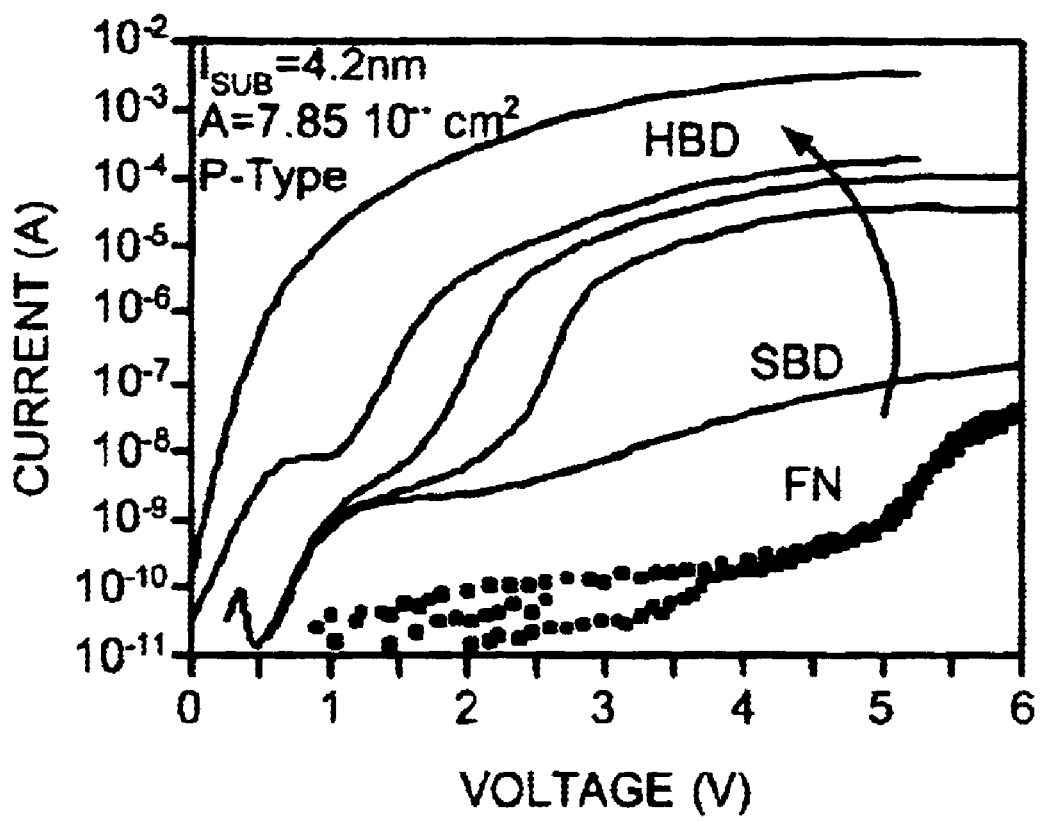
FIG. 13 is a graph showing various stages in the current-voltage characteristics of an ultra-thin gate oxide as degradation proceeds.

Sune et al. studied post SBD conduction in ultra-thin silicon dioxide films. Jordi Sune, Enrique Miranda, Post Soft Breakdown conduction in SiO2 Gate Oxides, IEDM 00-533, 2000. Various stages in the current-voltage ("I–V") characteristics of an ultra-thin gate oxide as degradation proceeds are shown in FIG. 13, in which the x-axis is voltage in volts and the y-axis is current in amperes expressed logarithmically. FIG. 13 shows that a broad range of voltages may be used to program the gate oxide storage element, and that either SBD or HBD may be used to store information in the gate oxide storage element. Several post breakdown I–V characteristics are also included that show the evolution from SBD to HBD. The amount of the leakage current resulting at SBD and HBD as well as at the intermediate situations between these two extremes is roughly linearly dependent on the magnitude of the voltage in a range of about 2.5 volts to 6 volts.

Figure 14:
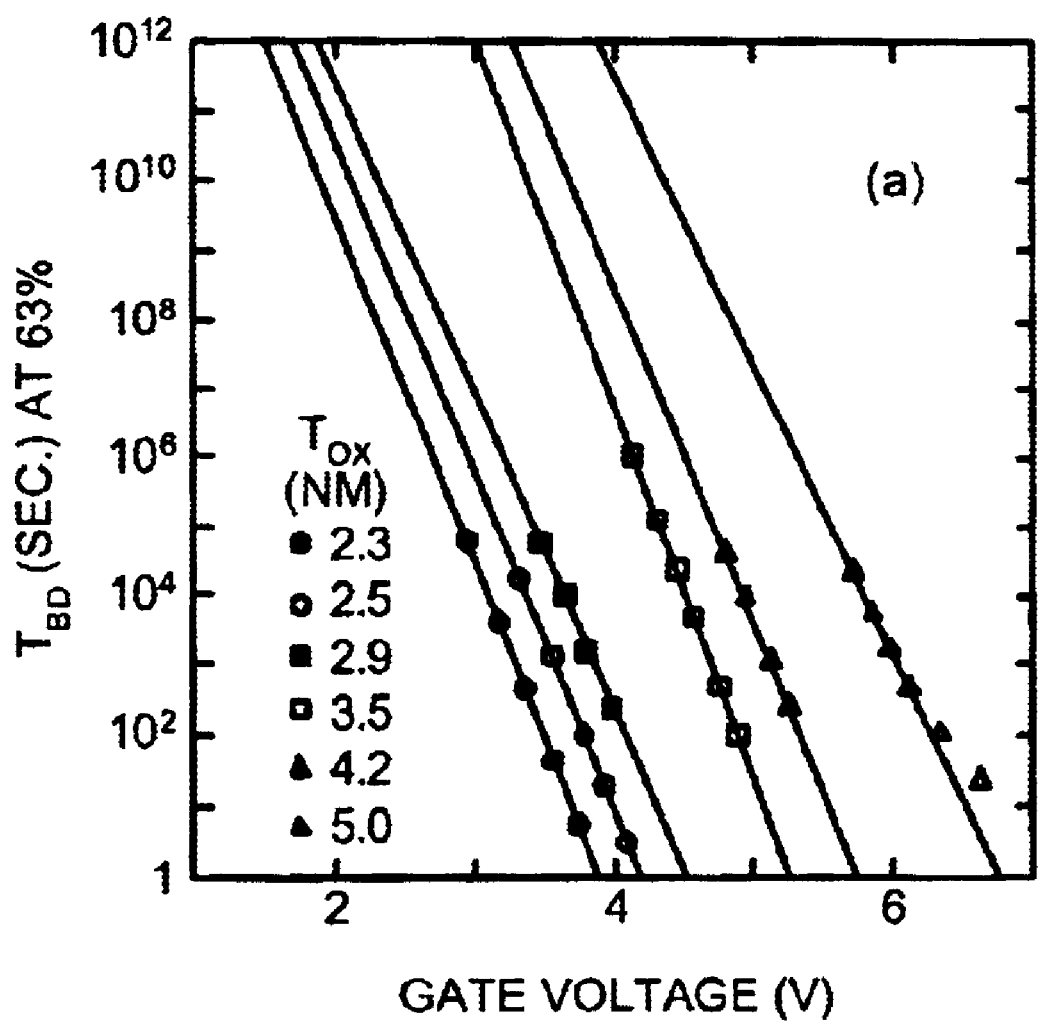
FIG. 14 is a graph showing time-to-breakdown at 63% distribution vs. gate voltage in a semi-log scale measured on n-channel field effect transistors (inversion) for various oxide thickness.

Wu et al. studied the voltage dependency of voltage acceleration for ultra-thin oxides. E.Y. Wu et al., Voltage- Dependent Voltage-Acceleration of Oxide Breakdown for Ultra-Thin Oxides, IEDM 00-541, 2000. FIG. 14 is a graph of time-to-breakdown at 63% distribution vs. gate voltage in a semi-log scale measured n channel FETs (inversion) for oxide thickness varying from 2.3 nm to 5.0 nm. The distributions are in general agreement and are linear, further indicating that the process is controllable.

Figure 15:
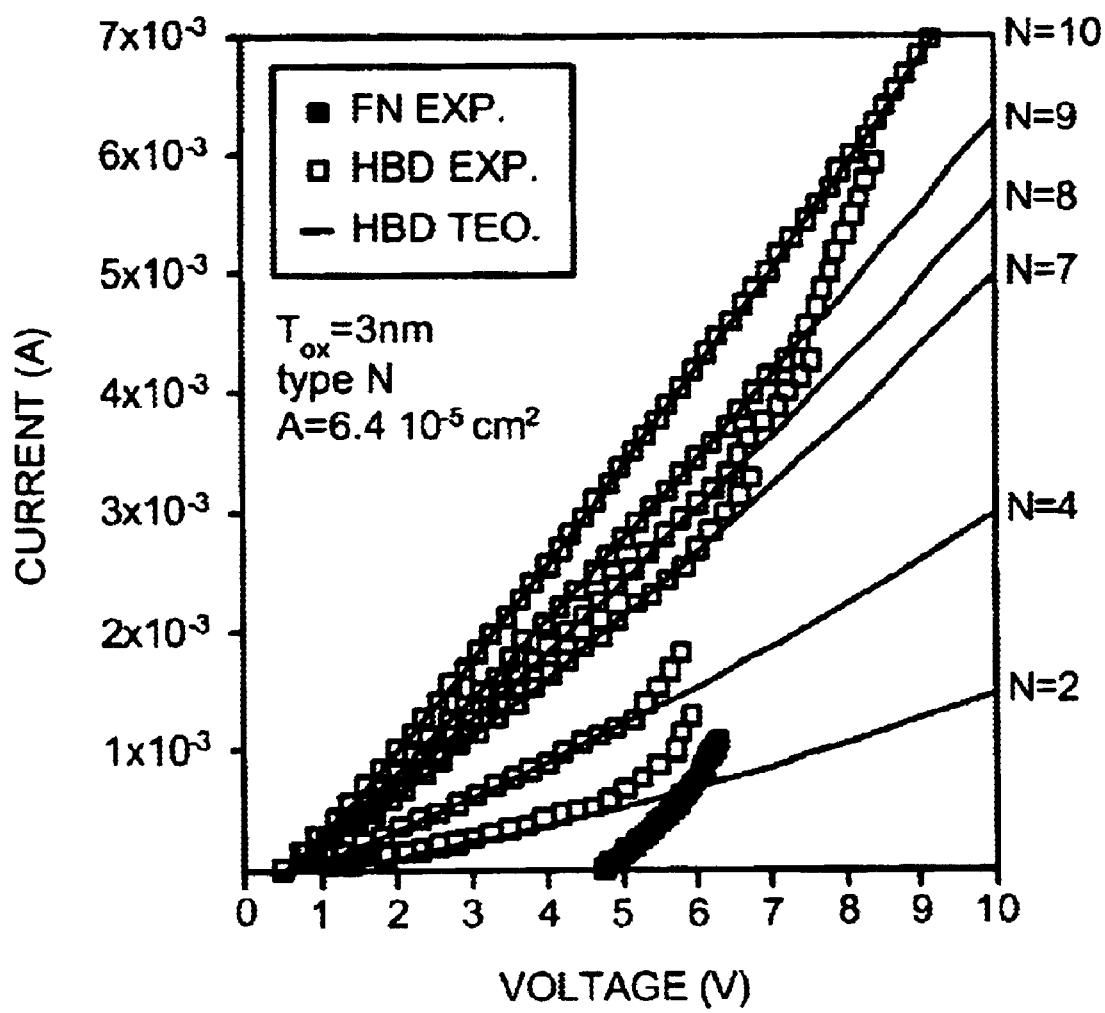
FIG. 15 is a graph showing the current-voltage characteristics of n type devices measured after the detection of successive breakdown events.

Miranda et al. measured the I–V characteristics of nMOSFET devices having an oxide thickness of 3 nm and an area of $6.4 \times 10^{-5}$ cm$^2$ after the detection of successive breakdown events. Miranda et al., "Analytic Modeling of Leakage Current Through Multiple Breakdown Paths in SiO$_2$ Films", IEEE 39$^{th}$ Annual International Reliability Physics Symposium, Orlando, Fla., 2001, pp 367–379. FIG. 15 shows the results corresponding to the linear regime in which "N" is the number of conducting channels. The results are quite linear, indicating that the path is essentially resistive.

Figure 16:
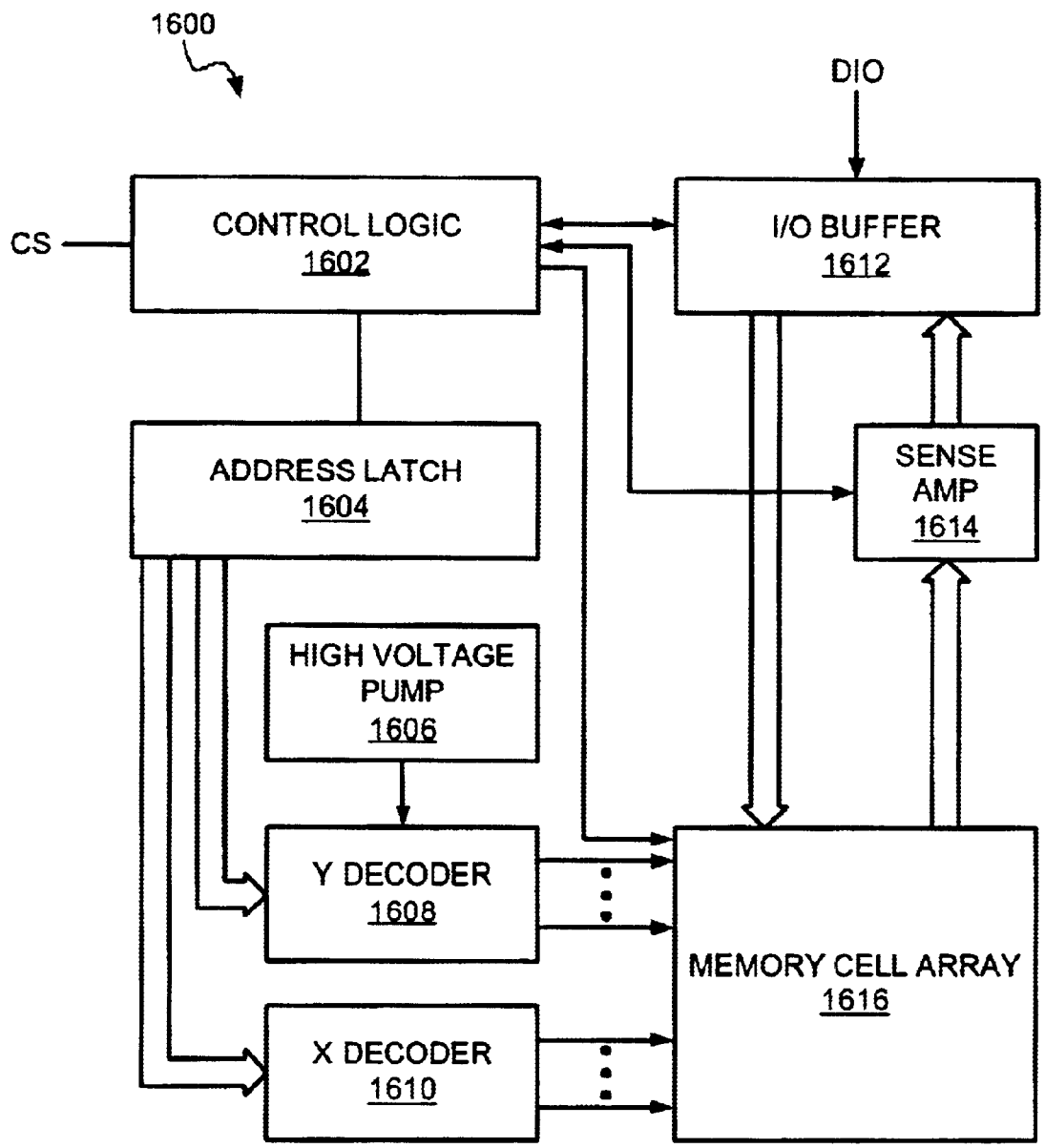
FIG. 16 is a block schematic diagram of a semiconductor memory.

The memory array 100 shown in FIG. 1 is in practice part of a memory integrated circuit that includes many other well-known elements such as sense amplifiers, pull-up circuits, word line amplifiers, sense amplifiers, decoders, voltage multipliers, and so forth. An illustrative memory 1600 is shown in FIG. 16, and includes control logic 1602, an address latch 1604, a high voltage pump 1606, a Y decoder 1608, an X decoder 1610, an input/output buffer 1612, a sense amplifier 1614, and a memory cell array 1616, which may be like the memory array 100 or the memory array 500. The high voltage pump 1606 is useful in some arrangements such as shown in the tables of FIGS. 8 and 9 requiring a high programming voltage such as 7.0 volts. The high voltage is furnished to the lines as required; in FIG. 16 the high voltage is required at the column or Y lines only, such as required by the arrangement indicated by the table of FIG. 8. As these elements and their use in conjunction with memory arrays whose operational parameters are clearly defined are otherwise well known in the art, they are not described further herein. It will be appreciated that memory 1600 is only illustrative as many other techniques for addressing a memory array, for transferring data into and out of a memory array, for supplying the various operating voltages required by the memory array, and so forth may be used as desired.

The memory incorporating the memory array 100 preferably is manufactured using any advanced process that makes n type gated devices, p type gated devices, or both types of devices, and can achieve a gate dielectric that is sufficiently thin to be stressed to SBD or HBD in a practical time using a voltage that is less than the junction voltage or the available thickest oxide breakdown voltage. Advanced CMOS logic processes are quite suitable, and are described in the literature; see, e.g., U.S. Pat. No. 5,700,729, issued Dec. 23, 1997 to Lee et al. Processing services using such processes are available from various manufacturers, including Taiwan Semiconductor Manufacturing Company, Ltd. ("TSMC") of Hsinchu, Taiwan, and San Jose, Calif.; United Microelectronics Corporation ("UMC") of Hsinchu, Taiwan, and Chartered Semiconductor Ltd. of Singapore and San Jose, Calif. However, any of a great many different MOS processes of different lithography may be used, including but not limited to 0.25 µm, 0.18 µm, 0.15 µm, and 0.13 µm which are commonly available at present, and lithography of 0.10 µm and better which are likely to be commonly available in the future.

All of the various MOS transistors, MOS half-transistors, and MOS capacitors used in the various memory cells described herein in most cases are normal low voltage logic transistors having, for example, an ultra-thin gate oxide thickness on the order of 50 Å for a 0.25 µm process, or on the order of 20 Å for a 0.13 µm process. The voltage across such an ultra-thin gate oxide can be temporarily during programming much higher than V$_{CC}$, which typically is 2.5 volts for an integrated circuit fabricated with a 0.25 µm process, and 1.2 volts for an integrated circuit fabricated with a 0.13 µm process. Such ultra-thin oxides typically can stand up to as much as 4 or 5 volts without significant degradation on the transistor performance. In the event that voltages are used in the memory array that expose the cell select transistors to more than about 4 volts, which is the case for the voltages shown in the table of FIG. 9, the cell select transistors preferably are fabricated with a thicker gate oxide while the half-transistors or capacitors are fabricated with the ultra-thin gate oxide. Many CMOS logic processes provide for the formation of both an ultra-thin gate oxide and a thicker oxide for input/output ("I/O") purposes, the thicker oxide being, for example, about 70 Å for an integrated circuit fabricated for a 3.3 volt I/O, and about 50 Å for an integrated circuit fabricated for a 2.5 volt I/O.

The description of the invention and its applications as set forth herein is illustrative and is not intended to limit the scope of the invention. Variations and modifications of the embodiments disclosed herein are possible, and practical alternatives to and equivalents of the various elements of the embodiments are known to those of ordinary skill in the art. For example, the various voltages set forth in the various examples are only illustrative, since one has some discretion as to the precise voltage to select within a range of voltages, and the voltages are in any event dependent on the device characteristics. The terms row line, column line, and source line have been used to describe types of lines commonly used in memories, but some memories may alternatives thereto. Generally speaking, row lines may be considered to be a specific type of select line, and column and source lines may be considered to be specific types of access lines. These and other variations and modifications of the embodiments disclosed herein may be made without departing from the scope and spirit of the invention.

What is claimed is:

1. A programmable read only memory cell useful in a memory array comprising:

a MOS field effect transistor having a gate, a gate dielectric underlying the gate, and first and second doped select semiconductor regions underlying both the gate dielectric and the gate in a spaced apart relationship to define a channel region therebetween;

a MOS data storage element having a conductive structure, an ultra-thin dielectric underlying the conductive structure, and a first doped storage semiconductor region underlying both the ultra-thin dielectric and the conductive structure, said conductive structure coupled to said first doped select semiconductor region;

a row select line coupled to the gate of the MOS field effect transistor;

a column select line coupled to the second doped select semiconductor region of the MOS field effect transistor; and a row program line coupled to the first doped storage semiconductor region of the MOS data storage element.

2. The memory cell of claim 1 wherein each of the MOS data storage elements comprises an inversion-enabled region underlying both the ultra-thin dielectric and the conductive structure.

3. The memory cell of claim 1 wherein the gate dielectric has the same thickness as said ultra-thin dielectric.

4. A programmable read only memory cell useful in a memory array having row select lines, column select lines, and row program lines, the memory cell comprising a select transistor coupled in series with a two terminal data storage element, the data storage element comprising a doped region, an ultra-thin dielectric, and a conductive layer, the doped region connected to a row program line, the conductive layer connected to the source of said select transistor, the select transistor further having a gate coupled to a row select line and its drain connected to a column select line, the select transistor having a gate dielectric that has the same thickness as said ultra-thin dielectric.

5. The memory cell of claim 4 wherein the data storage element is a MOS half-transistor.

6. The memory cell of claim 4 wherein the data storage element is a MOS capacitor.

7. A method of operating a programmable read only memory array comprising a plurality of row select lines, a plurality of column select lines, at least one row program line, and a plurality of memory cells at respective crosspoints of the row select lines and column select lines, each of the memory cells comprising a MOS field effect transistor coupled in series with a MOS data storage element between one of the column select lines and one of the at least one row program line, the MOS transistor further having a gate coupled to one of the row select lines and the MOS data storage element comprising an ultra-thin dielectric for physical storage of data, the method comprising:

applying a first voltage to a selected one of the row select lines for turning on each of MOS field effect transistor having the gate thereof coupled to the selected row select line;

applying a second voltage to a selected one of the column select lines; and applying a third voltage to the at least one row program line;

wherein the second voltage and the third voltage cause a potential difference across the ultra-thin dielectric of the memory cell coupled to the selected row select line and the selected column select line that is sufficient to break down the ultra-thin dielectric thereof.

8. The method of claim 7 wherein the breakdown of the ultra-thin dielectric is a hard breakdown.

9. The method of claim 7 wherein the breakdown of the ultra-thin dielectric is a soft breakdown.

10. The method of claim 8 wherein the first voltage is about 2 volts, the second voltage is about 0 volts, and the third voltage is about 5.5 volts.

11. A programmable read only memory array comprising a plurality of row select lines, a plurality of column select lines, at least one row program line, and a plurality of memory cells at respective crosspoints of the row select lines and column select lines in the memory, each of the memory cells comprising a select transistor coupled in series with a data storage element between one of the column select lines and said at least one program line, the select transistor further having a gate coupled to one of the row select lines and the data storage element comprising an ultra-thin dielectric for physical storage of data.

12. The memory of claim 11 wherein the data storage element is a MOS half-transistor.

13. The memory of claim 11 wherein the data storage element is a MOS capacitor.

* * * * *